(12) United States Patent
Bienvenu et al.

(10) Patent No.: US 11,381,233 B2
(45) Date of Patent: Jul. 5, 2022

(54) CIRCUIT FOR PROTECTING A POWER SWITCH

(71) Applicant: STMicroelectronics (Rousset) SAS, Rousset (FR)

(72) Inventors: Philippe Bienvenu, Saint-Maximin (FR); Antonio Calandra, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 802 days.

(21) Appl. No.: 16/028,559

(22) Filed: Jul. 6, 2018

(65) Prior Publication Data

US 2019/0013804 A1 Jan. 10, 2019

(30) Foreign Application Priority Data

Jul. 7, 2017 (FR) ........................ 1756437

(51) Int. Cl.
*H03K 17/082* (2006.01)
*H03K 5/24* (2006.01)
(Continued)

(52) U.S. Cl.
CPC ......... *H03K 17/0822* (2013.01); *H03K 3/037* (2013.01); *H03K 5/24* (2013.01); *H02H 3/006* (2013.01); *H02H 3/202* (2013.01)

(58) Field of Classification Search
CPC ............. H03K 17/0822; H03K 17/081; H03K 17/082; H03K 17/0814; H03K 17/0812; H03K 17/13; H03K 17/161–168; H03K 21/40; H03K 21/08; H03K 21/10; H03K 21/12; H03K 3/037; H03K 3/0375; H03K 3/28; H03K 3/281; H03K 3/287;
(Continued)

(56) References Cited

U.S. PATENT DOCUMENTS

| | | | | |
|---|---|---|---|---|
| 4,745,299 A | * | 5/1988 | Eng .................... | H02J 9/062 307/66 |
| 5,055,703 A | * | 10/1991 | Schornack ............ | H02J 9/062 307/64 |

(Continued)

FOREIGN PATENT DOCUMENTS

EP  0678751 A1  4/1995
FR  2895115 A1  6/2007
(Continued)

OTHER PUBLICATIONS

Office Action 1 for co-pending EP Appl. No. 18180160.6 dated Feb. 7, 2019 (5 pages).
(Continued)

*Primary Examiner* — Thienvu V Tran
*Assistant Examiner* — Nusrat Quddus
(74) *Attorney, Agent, or Firm* — Crowe & Dunlevy

(57) ABSTRACT

A protection circuit for a transistor switch coupled to a power supply rail operates to modulate a control voltage at a control terminal of the transistor switch. A first circuit detects an overload across the terminals of the switch with respect to a threshold to generate a signal which modulates the control voltage. A second circuit operates to adjust a value of the threshold in response to sensed variations in a supply voltage at the power supply rail.

26 Claims, 2 Drawing Sheets

(51) Int. Cl.
*H03K 3/037* (2006.01)
*H02H 3/20* (2006.01)
*H02H 3/00* (2006.01)

(58) Field of Classification Search
CPC ........ H03K 3/288; H03K 5/24; H03K 5/2436;
H03K 5/2472; H03K 5/2481; H03K
2005/00013; H05K 19/017; H05K
19/0185; H05K 19/08; H05K 19/0813;
H05K 19/094; G01R 31/08; H02H 3/00;
H02H 3/20; H02H 3/24; H02H 3/027;
H02H 3/32; H02H 3/021; H02H 3/025;
H02H 3/033; H02H 3/06; H02H 3/093;
H02H 3/042; H02H 3/048; H02H 3/08;
H02H 3/081; H02H 3/083; H02H 3/10;
H02H 3/105; H02H 3/202; H02H 3/253;
H02H 3/26; H02H 3/325; H02H 3/347;
H02H 3/42; H02H 7/00; H02H 9/00;
H02H 9/04; H02H 9/042; H02H 9/043;
H02H 9/002; H02H 9/001; H02H 9/02;
H02H 9/004; H02H 9/023; H02H 9/025;
H02H 9/041; H02H 9/046; H02H 9/049;
H01H 47/14; H01H 47/28; H01H 47/00;
H01H 47/20; H01H 47/32; H01H 47/18;
H01H 9/00; H02M 2001/0048; H02M
2001/0058; H02M 2001/123; H02M 1/34;
H02M 1/32; H02M 1/126; H02M
2007/4815; H02M 2007/4803; H02M
5/257; H02M 5/271–273; H02M 5/293;
H02M 7/537; H02M 7/538–53875
See application file for complete search history.

(56) References Cited

U.S. PATENT DOCUMENTS

| | | | | |
|---|---|---|---|---|
| 5,440,441 A * | 8/1995 | Ahuja | ...................... | H02H 3/06 361/62 |
| 5,629,542 A * | 5/1997 | Sakamoto | ........... | H01L 27/0629 257/328 |
| 5,629,610 A * | 5/1997 | Pedrazzini | ............ | H02M 3/156 323/283 |
| 5,898,238 A * | 4/1999 | Dombrowski | ........ | G06F 1/3215 307/130 |
| 5,963,439 A * | 10/1999 | Wuidart | .............. | H02M 3/1584 363/46 |
| 6,137,267 A * | 10/2000 | Kates | .................. | H02M 3/1588 320/136 |
| 6,150,802 A * | 11/2000 | Andrews | ............... | H02M 3/156 323/282 |
| 6,242,895 B1 * | 6/2001 | Fujii | ........................ | G05F 1/70 323/207 |
| 6,249,409 B1 * | 6/2001 | Bienvenu | ............ | H01L 27/0251 361/54 |
| 6,483,376 B1 * | 11/2002 | Bienvenu | .............. | H02M 3/073 327/390 |
| 6,487,059 B2 * | 11/2002 | Bontempo | ............. | H02M 3/28 361/90 |
| 6,518,731 B2 * | 2/2003 | Thomas | ................ | H02J 7/0029 320/136 |
| 7,230,813 B1 * | 6/2007 | Canova | .................. | H02H 3/025 361/93.1 |
| 7,825,645 B2 * | 11/2010 | Bailly | ..................... | H02M 1/32 323/285 |
| 8,144,444 B2 * | 3/2012 | Horsky | .................. | G05F 1/571 361/111 |
| 8,537,517 B1 * | 9/2013 | Banak | .................. | H02H 11/002 361/93.1 |
| 8,547,675 B2 * | 10/2013 | Maier | ..................... | G05F 1/569 361/93.1 |
| 9,866,009 B2 * | 1/2018 | Oka | ....................... | H02H 3/087 |
| 9,954,548 B2 * | 4/2018 | Illing | .................... | H02H 3/093 |
| 10,164,424 B2 * | 12/2018 | Koh | ......................... | H02H 9/04 |
| 10,170,905 B2 * | 1/2019 | Illing | ...................... | H03M 1/12 |
| 10,298,251 B2 * | 5/2019 | Illing | ...................... | H02H 3/38 |
| 10,734,799 B2 * | 8/2020 | Costa | ...................... | H02H 3/08 |
| 2002/0044463 A1 * | 4/2002 | Bontempo | ............. | H02M 3/28 363/21.07 |
| 2002/0149415 A1 * | 10/2002 | Bienvenu | ............. | H03K 17/063 327/442 |
| 2003/0179033 A1 * | 9/2003 | Bienvenu | ................ | G05F 3/245 327/427 |
| 2004/0046614 A1 * | 3/2004 | Pigott | .................... | H03K 4/066 331/57 |
| 2004/0150928 A1 * | 8/2004 | Goodfellow | ........ | H02M 3/1584 361/90 |
| 2005/0270807 A1 * | 12/2005 | Strijker | ............. | H02M 3/33507 363/21.01 |
| 2006/0291258 A1 * | 12/2006 | Zhu | ........................ | H02M 1/32 363/21.12 |
| 2008/0212248 A1 * | 9/2008 | Zhu | .................. | H02M 3/33507 361/97 |
| 2009/0027020 A1 * | 1/2009 | Qiu | ...................... | H02M 3/1588 323/282 |
| 2009/0058574 A1 * | 3/2009 | Stiedl | ..................... | H02H 9/025 335/18 |
| 2009/0147423 A1 * | 6/2009 | Mulligan | .......... | H02J 7/007182 361/91.1 |
| 2012/0081092 A1 * | 4/2012 | Pavlin | ...................... | G05F 1/46 323/282 |
| 2014/0055119 A1 * | 2/2014 | Bienvenu | ................ | G05F 3/262 323/311 |
| 2017/0288662 A1 * | 10/2017 | Djelassi | ............ | H03K 17/0822 |
| 2018/0090924 A1 * | 3/2018 | Djelassi | ............... | H03K 17/284 |
| 2020/0067503 A1 * | 2/2020 | Bienvenu | .......... | G01R 31/2831 |

FOREIGN PATENT DOCUMENTS

WO     2014199100 A2    12/2014
WO     2017062715 A1     4/2017

OTHER PUBLICATIONS

Office Action 2 for co-pending EP Appl. No. 18180160.6 dated Mar. 28, 2019 (3 pages).
Office Action 3 for co-pending EP Appl. No. 18180160.6 dated Jun. 19, 2019 (7 pages).
INPI Search Report and Written Opinion for FR 1756437 dated May 14, 2018 (10 pages).
Fourth Office Action for co-pending EP Appl. No. 18180160.6 dated Jan. 30, 2020 (4 pages).

* cited by examiner

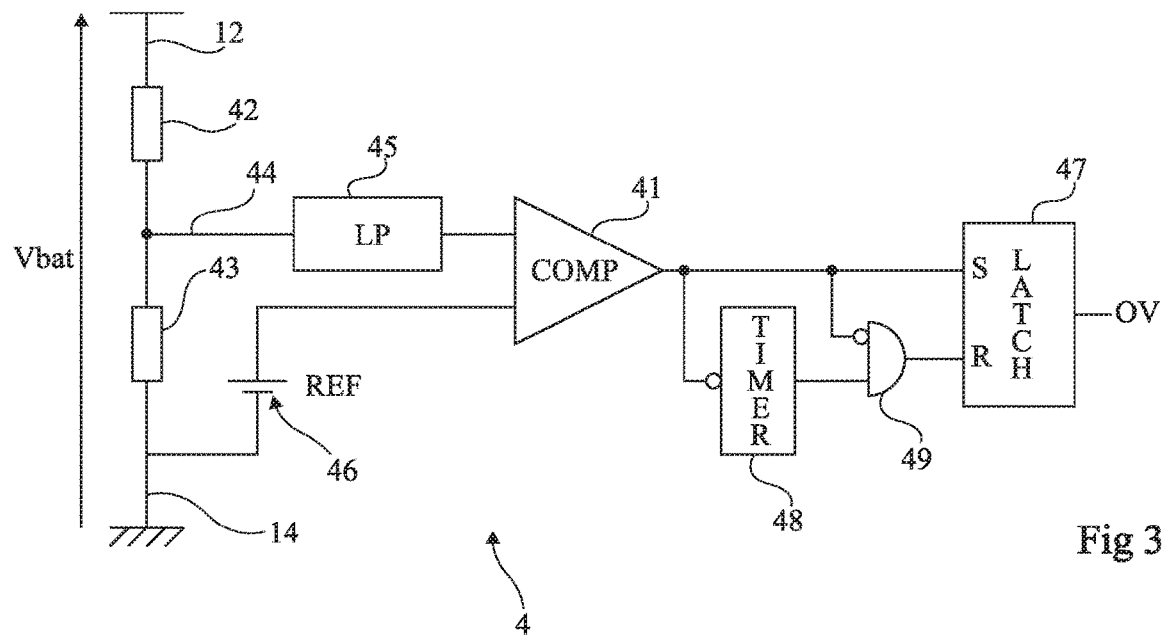
Fig 3
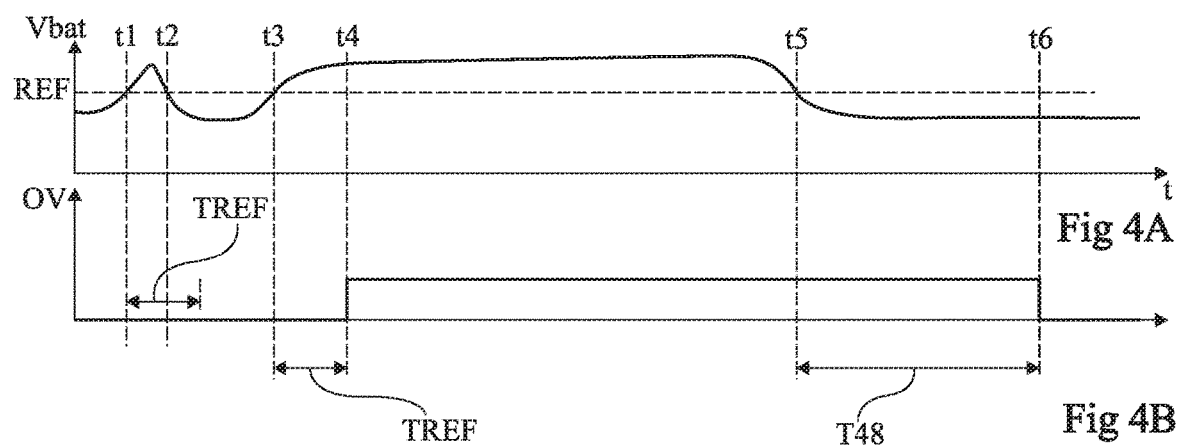
Fig 4A
Fig 4B

CIRCUIT FOR PROTECTING A POWER SWITCH

PRIORITY CLAIM

This application claims the priority benefit of French Application for Patent No. 1756437, filed on Jul. 7, 2017, the content of which is hereby incorporated by reference in its entirety to the maximum extent allowable by law.

TECHNICAL FIELD

The present description generally relates to electronic circuits and, more particularly, to a circuit for protecting a power switch from overloads. The present description applies more particularly to a power supply switch for switching the supply of power to a DC load.

BACKGROUND

Electronic power switches (for example, MOS power transistors) produced using semiconductor materials are widely used to control the supply of power to loads from a DC power supply source, for example a battery. In an electrical network supplied with power by a battery, for example the electrical network of an automotive vehicle, numerous power switches are found which serve to supply power to multiple loads. The power switches, associated with the loads that they control, are connected in parallel on one or more power lines conveying the DC current.

In order to protect the power switches from potential DC overloads, each switch or group of switches is generally associated with a circuit for protection from an overcurrent in the event that the load is shorted.

SUMMARY

One embodiment overcomes drawbacks associated with circuits for protecting power switches from overloads.

One embodiment proposes an overload detection circuit.

One embodiment proposes a solution that is particularly suitable for protecting MOS power transistors.

One embodiment proposes a solution that is particularly simple and compatible with conventional overload detectors.

In an embodiment, a circuit for protecting at least one switch linked to a power supply rail comprises: a first circuit for detecting an overload across the terminals of the switch with respect to a first threshold; and a second circuit for adjusting the value of the first threshold according to variations in a supply voltage.

According to one embodiment, the second circuit includes: a comparator for comparing information representative of the supply voltage with at least a first level; and at least a first element for validating the result of the comparison over at least a first duration for a modulation of the first threshold.

According to one embodiment, said first duration is longer than the duration of transient variations in the supply voltage.

According to one embodiment, the second circuit additionally includes a second element for validating the result of the comparison over a second duration.

One embodiment provides a control module, comprising: at least one switch for controlling a load; and at least one protection circuit.

According to one embodiment, the protection circuit modulates a control signal for controlling the switch in order to regulate the current that flows therethrough in the on state.

According to one embodiment, the first circuit for detecting an overload includes an element for comparing information representative of the current in the switch with said first threshold.

BRIEF DESCRIPTION OF THE DRAWINGS

These features and advantages, and others, will be described in detail in the following non-limiting description of particular embodiments, which is given with reference to the appended figures, in which:

FIG. 3 is a highly schematized representation, in block form, of one embodiment of a circuit for adjusting a detection threshold of an overload detector; and FIGS. 4A and 4B are timing diagrams illustrating the operation of a circuit for adjusting a threshold of an overload detector.

DETAILED DESCRIPTION

The same elements have been referenced by the same references in the various figures which, in particular for the timing diagrams, have been drawn without attention to scale. In particular, the structural and/or functional elements common to the different embodiments may have the same references and may have identical structural, dimensional and material properties.

For the sake of clarity, only those steps and elements which are of use in understanding the described embodiments have been shown and will be described in detail. In particular, the circuits or the loads controlled by power switches, and protected by protection circuits such as described, have not been described in detail, the embodiments described being compatible with the conventional applications.

Unless otherwise indicated, when reference is made to two interconnected elements, this means directly connected with no intermediate element other than conductors, and when reference is made to two interlinked elements, this means that these two elements may be directly linked (connected) or linked via one or more other elements.

Throughout the following description, unless specified otherwise, the expressions "approximately", "substantially" and "of the order of" signify to within 10%, preferably to within 5%.

Figure 1:
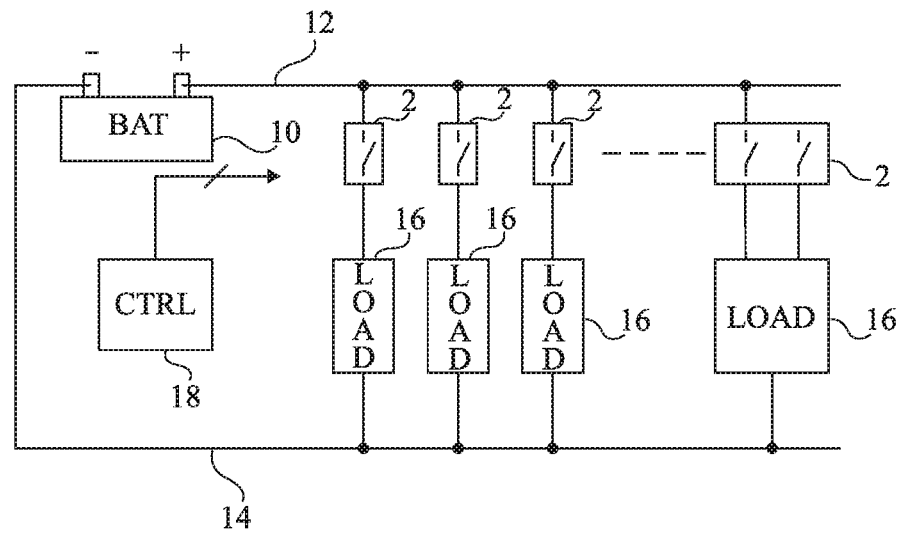
FIG. 1 is a highly schematized representation, in block form, of one example of an electrical network to which the described embodiments are applied.

FIG. 1 is a highly schematized representation, in block form, of one example of an electrical network to which the described embodiments are applied.

Hereinafter, an exemplary application to the field of automotive vehicles and to the DC electrical networks thereof, supplied with DC power from one or more batteries, is considered. However, all that which is described hereinafter is more generally applicable to any electrical network in which similar problems arise.

In an automotive vehicle, one or more batteries 10 (BAT) are connected to power supply buses consisting of a bus 12 at a positive potential with respect to a reference potential, and a reference or ground bus 14 that is connected to the chassis of the vehicle. Various electrical loads 16 (LOAD) are linked, via control circuit modules 2, to the power supply buses 12 and 14. Each module 2 includes one or more power switches for controlling the corresponding load. The loads are, for example, starter circuits, engine management circuits (ignition, injection), various computers, lighting and signaling circuits, motor power supply circuits (windscreen wipers, windscreen washers, seats, etc.), comfort and accessory circuits (heating, ventilation, central locking, etc.), etc. The switches of the control circuit modules 2 are controlled manually or from a central control unit (CTRL) 18.

The assembly of the loads 16 and their respective switching operations lead to electrical disruptions on the power supply buses 12 and 14. In particular, the operations of switching the various loads lead to overvoltages at the level of the various modules and loads that are linked to the buses 12 and 14.

The control circuit modules 2 are generally provided with circuits for protection from potential overloads in the on state in order to prevent the destruction of the power switches as a result of overheating. Specifically, the overvoltages that are liable to occur on the power supply buses 12 and 14 may reach hundreds of volts while the nominal DC operating voltage is of the order of 12 or 15 V. Provision is made for limiting the current in the power switch of the module in order to decrease the power and prevent its destruction. In order to achieve this, each switch or group of switches is associated with a protection circuit, the function of which is to decrease the control voltage of the switch in order to decrease its current.

Figure 2:
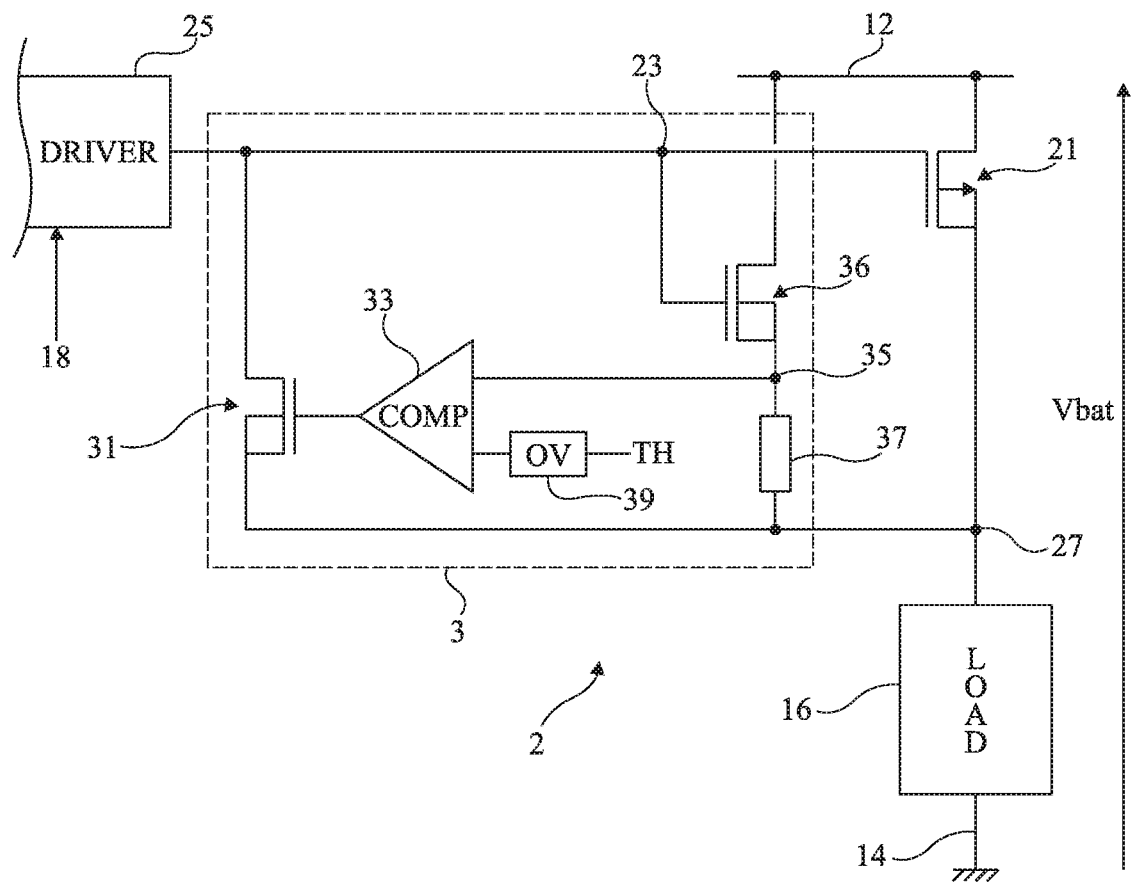
FIG. 2 is a highly schematized representation of one example of a module for controlling a load connected to the network of FIG. 1.

FIG. 2 is a highly schematized representation of one example of a control circuit module 2 for controlling the supply of power to a load 16. The control circuit module 2 includes a power switch 21 associated with a protection circuit 3 for protecting against overloads in the on state.

It is assumed that the power switch 21 is an MOS power transistor. The transistor 21 is in series with the load 16 that it controls between the buses 12 and 14 applying a battery voltage Vbat (i.e., a DC supply voltage). The gate 23 of the transistor 21 is connected at the output of a control circuit 25 (DRIVER). Depending on the type of load 16, the circuit 25 controls the switch 21 in "all-or-nothing" mode or in a variable mode by adjusting the gate voltage of the transistor 21. The circuit 25 receives a manual or electrical setpoint from the circuit 18.

The role of the protection circuit 3 is to modulate the gate voltage 23 of the transistor 21 according to the drain-source voltage across the terminals of this transistor 21. In one simplified embodiment, this modulation is an "all-or-nothing" modulation, i.e. the circuit 3 forces the transistor 21 to turn off in the event of an overvoltage across its terminals. Preferably, the modulation of the gate voltage of the transistor 21 is analog or gradual (stepwise). In order to achieve this, the protection circuit 3 includes a switch 31, typically an MOS transistor, linking the gate 23 and source 27 of the transistor 21. The role of the transistor 31 is, when it is on, to decrease the gate-source voltage (Vgs) of the transistor 21 in order to decrease its drain-source current (Ids) and, thus decrease the power dissipated in its drain-source resistor in the on state. The transistor 31 is controlled, for example, by a comparator 33 (COMP) for comparing information representative of the drain-source current of the transistor 21 with a threshold TH. A first terminal of the comparator 33 is connected to the midpoint 35 of an association of an MOS transistor 36 in series with a resistor 37 in series between the drain and source of the transistor 21, i.e. between the bus 12 and the source 27. A second terminal of the comparator 33 receives the comparison threshold TH of the voltage of point 35. When the voltage of point 35 exceeds the threshold TH, the output of the comparator 33 switches so as to turn the transistor 31 on. The drain-source resistance when the transistor 31 is in the on state determines the decrease in the gate-source voltage of the transistor 21, hence of the current in the module 2.

The circuit of FIG. 2 is an example and it is possible to find other protection circuit structures based on the principle of comparing the current that flows through the power transistor 21, or the voltage across its terminals, with a threshold in order to trigger a limitation of the current that flows therethrough.

Limiting or interrupting the current of the transistor 21 when an increase in the voltage is detected may prove to be problematic when the decrease in the current is dependent on the DC supply voltage. Specifically, if the current drawn by the module decreases, this causes, due to the non-negligible line inductance of the buses 12 and 14, an increase in the voltage Vbat. Consequently, this increase risks causes a new decrease in the current or interrupting other modules and so on in a snowball effect.

Furthermore, various phenomena may be the cause of an overvoltage. For example, in the event of a short circuit at the level of the load 16 controlled by the switch 21, the current in the switch 21 suddenly increases, as does the voltage across its terminals. Another possible situation is an overvoltage at the level of the bus 12. Such an overvoltage may be due to switching other loads connected to the network, in particular due to the inductive behavior of the aforementioned network.

The protection of a module on a heavily disrupted network, such as the electrical network of a vehicle, must adhere to multiple constraints. Besides not being sensitive to the oscillations of the DC supply voltage Vbat that are due to the operations of switching the various modules, the protection must not be triggered by transient phenomena such as, for example, sudden temporary increases linked to inrush currents when certain loads are powered up.

Typically, in the example of application to an electrical network of a vehicle supplied with power by a battery having a nominal DC voltage of 12 V, standards set operating ranges in which the loads must be able to be switched and acceptable durations of transient phenomena. For example, it must be possible to switch on a load under a voltage that may reach approximately 16 V. Moreover, it must be possible to switch on a load with inrush currents reaching around 10 times the value of the nominal current of the load.

According to one embodiment, provision is made for modifying the trigger threshold TH in order to take these constraints into account.

In the example of FIG. 2, this function is carried out by modulating the value of the threshold TH via a signal OV (circuit 39) that is indicative of an overvoltage. An example of the generation of the signal OV is described with reference to the following figures. In one simplified embodiment, provision may be made for activating or deactivating (in "all-or-nothing" mode) the protection according to the signal OV. For an "all-or-nothing" switching operation, provision is made, for example, for a zero-valued threshold TH.

FIG. 3 is a highly schematized representation, in block form, of one embodiment of a circuit 4 for adjusting a detection threshold TH of an overload detector like that shown in FIG. 2.

The representation of FIG. 3 is functional. Its various elements could be produced on the basis of hardware or software designed to comply with the described function.

The circuit 4 of FIG. 3 delivers the signal OV indicative of the presence of an overvoltage to be considered by the circuit 3. Typically, the signal OV is intended to determine the value of the threshold TH of the protection circuit, for example of the type of the circuit 3 of FIG. 2.

In the example of FIG. 3, the circuit 4 includes a comparator 41 (COMP) for comparing information representative of the DC supply voltage Vbat with a reference or threshold REF. The threshold REF is fixed. The information representative of the DC supply voltage Vbat is, in a simplified and schematized manner, obtained by means of a resistive divider bridge, consisting of two resistive elements 42 and 43 in series between the buses 12 and 14. The midpoint 44 of this series association delivers instantaneous information representative of the DC supply voltage Vbat. This information is filtered by a low-pass function 45 (LP) of time constant TREF, before reaching the comparator 41 in order to remove transient variations. The level REF is set by a voltage source 46 of fixed value.

The output of the comparator 41 delivers a digital signal, having two levels in the example of FIG. 3. The information delivered by the comparator 41 is memorized, for example in a flip-flop 47 (LATCH), the output of which delivers the value OV. The output of the comparator 41 activates, on a rising edge, the S "set" input of the flip-flop 47. The flip-flop 47 is reset on condition that the level of the DC supply voltage Vbat has come back down after a certain time. In order to achieve this, the output of the comparator 41 activates, on a falling edge, a timer or timeout 48 (TIMER) introducing a delay T48. The output of the timer 48 is combined with the inverse of the output of the comparator 41 by an AND gate 49, the output of which is linked to a reset terminal R of the flip-flop 47.

As a variant, the low-pass filter function 45 may be carried out by a timer at the output of the comparator 41. The output of this timer then switches only if the output of the comparator 41 indicates that the threshold REF has been exceeded for a duration that is longer than a reference duration TREF, the timer being reset as soon as the output of the comparator 41 switches to the rest state. The duration TREF is chosen according to the transient disruptions that are desired not to be taken into account. By way of particular exemplary embodiment, the duration TREF is of a few microseconds and the duration T48 is of the order of a few tens of microseconds.

FIGS. 4A and 4B illustrate, by means of timing diagrams, the operation of the circuit of FIG. 3. FIG. 4A illustrates an example of the appearance of the DC voltage Vbat. FIG. 4B illustrates the corresponding appearance of the signal OV.

In the presence of overvoltages of short duration (for example between times t1 and t2) above a nominal DC voltage of the battery, i.e. having a duration that is shorter than the time constant of the filter 45, nothing happens at the output of the comparator 41.

If the overvoltage (for example from a time t3) about the nominal DC voltage of the battery lasts for a sufficiently long time, i.e. more than the time constant TREF introduced by the filter 45, the S "set" input of the flip-flop 47 is activated (time t4) at the end of time TREF and its output OV switches (arbitrarily to the high state).

When the overvoltage ends (time t5), the timer 48 is triggered and, if the overvoltage does not reoccur before the timeout T48 has expired, the flip-flop 47 is reset (time t6).

The signal OV is used to adjust the value of the threshold TH (FIG. 2). In the example shown, this adjustment is carried out between two values, respectively high and low. This amounts to taking an overvoltage into account only when it is validated by the circuit 4. In the absence of an overvoltage, the value of the threshold TH is higher than its value in the presence of an overvoltage.

According to another embodiment, the circuit 4 is used directly as a protection circuit for switching the transistor 31 of FIG. 2. The comparator 41 then acts as the comparator 33 and the signal OV is applied to the gate of the transistor 31. The divider bridge 42-43 replaces the divider bridge 36-37.

According to another embodiment, provision is made for multiple voltage references to which various levels of decreasing the current in the transistor 21 are assigned. For example, the value of the current is divided by two between 16 and 20 V, then by four beyond 20 V. In order to achieve this, the transistor 31 is controlled in an analog manner.

One advantage of the embodiments described is that it is now possible:
not to take transient overvoltages present on the bus into account; and
to disconnect the module in the event of a short circuit in the load that it controls, without negatively affecting the operation of the other modules.

Another advantage is that the overvoltage detection and protection circuit may be integrated with the transistor 21 in the switching module 2.

Another advantage is that the proposed solution may be implemented at the level of each module 2 (FIG. 1). Thus, it is compatible with existing networks, which may include both conventional modules and enhanced modules such as described.

Particular embodiments have been described. Diverse variants and modifications will be apparent to those skilled in the art. In particular, the choice of durations TREF and T48 depend on the application and may vary. These durations may even vary from one module to another. Furthermore, the described detection function may be implemented in an analogue, digital or mixed manner. Moreover, although a solution in which the control modules are directly connected to one of the power supply rails has been described, certain modules may be linked thereto via other elements, for example, between two loads connected to the power supply rails. Additionally, the case of a power switch connected to the positive power supply rail has been taken as an example, but all that has been described is easily transferable to modules having power switches that are connected to the negative or reference rail.

It should be noted that a person skilled in the art could combine various elements of these various embodiments and variants without exercising inventive skill. Lastly, the implementation of the embodiments that have been described is within the scope of a person skilled in the art on the basis of the functional information given above and by using circuits that are conventional per se.

The invention claimed is:

1. A circuit for protecting a transistor switch coupled to a power supply rail, comprising:
a first circuit configured to detect an overload across terminals of the transistor switch with respect to a first threshold; and
a second circuit configured to adjust a value of the first threshold according to variations in a supply voltage at the power supply rail from a nominal voltage;

wherein the second circuit comprises:
  a comparator configured to compare a filtered supply voltage with at least a first level; and
  a first validation circuit configured to validate a result of the comparison made by the comparator over at least a first duration of time for a modulation of the value of the first threshold, said first validation circuit comprising a filter circuit configured to filter said supply voltage and generate the filtered supply voltage;
wherein said first duration of time is longer than a duration of a transient variation in the supply voltage from the nominal voltage.

2. The circuit according to claim 1, wherein the nominal voltage is a nominal battery voltage.

3. The circuit according to claim 1, wherein the supply voltage is a DC battery voltage.

4. The control circuit according to claim 1, further comprising a circuit that modulates a control signal for controlling actuation of the transistor switch in order to regulate a current that flows through the transistor switch when in an on state.

5. The control circuit according to claim 1, wherein the first circuit includes a circuit configured to compare information representative of a current flowing through the transistor switch with said first threshold.

6. A circuit for protecting a power transistor coupled to a load, comprising:
  a current sensor configured to sense load current flowing through the power transistor;
  a comparison circuit configured to compare the sensed load current to a threshold;
  a modulation circuit configured to modulate a control voltage at a control terminal of the power transistor in response to an output signal generated by said comparison circuit;
  a threshold control circuit configured to sense a supply voltage provided to said power transistor and change the threshold at the comparison circuit in response to change in the sensed supply voltage from a nominal voltage; and
  a filter circuit configured to filter the sensed supply voltage to remove any change in the sensed supply voltage having a time constant that is less than a time constant value of the filter circuit.

7. The circuit of claim 6, further comprising:
  a further comparator having a first input coupled to receive a filtered sensed supply voltage from the filter circuit and a second input coupled to receive a fixed threshold voltage;
  a threshold setting circuit responsive to an output of the further comparator, the threshold setting circuit configured to set the threshold at the comparison circuit in response to the further comparator output.

8. The circuit of claim 7, wherein the threshold setting circuit comprises a set/reset latch circuit that is set in response to the further comparator output and reset in response to a delay of the further comparator output.

9. The circuit of claim 8, wherein an output of the set/reset latch circuit controls changing of the threshold at the comparison circuit.

10. The circuit of claim 8, further comprising:
  a timer circuit configured to receive a logical inversion of the further comparator output; and
  a logic gate configured to logically combine the further comparator output with an output of the timer circuit to generate a reset signal applied to reset the set/reset latch circuit.

11. The circuit of claim 10, wherein the logic gate is a logic AND gate.

12. The circuit of claim 6, wherein the nominal voltage is a nominal battery voltage.

13. The circuit of claim 6, wherein the supply voltage is a DC battery voltage.

14. A circuit for protecting a power transistor coupled to a load, comprising:
  a voltage sensor configured to sense a supply voltage provided to said power transistor;
  a filter circuit configured to filter the sensed supply voltage to remove any change in the sensed supply voltage having a time constant that is less than a time constant value of the filter circuit;
  comparison circuit configured to compare a filtered sensed supply voltage from the filter circuit to a fixed threshold voltage;
  a set/reset latch circuit that is set in response to the comparison circuit output and reset in response to a delay of the comparison circuit output; and
  a modulation circuit configured to modulate a control voltage at a control terminal of the power transistor in response to an output signal generated by said set/reset latch circuit.

15. The circuit of claim 14, wherein the supply voltage is a DC battery voltage.

16. A circuit for protecting a transistor switch coupled to a power supply rail, comprising:
  a first circuit configured to detect an overload across terminals of the transistor switch with respect to a first threshold; and
  a second circuit configured to adjust a value of the first threshold according to variations in a supply voltage at the power supply rail from a nominal voltage;
wherein the second circuit comprises:
  a first comparator circuit configured to compare information representative of the supply voltage with at least a first level;
  a first validation circuit configured to validate a result of the comparison made by the first comparator circuit over at least a first duration of time for a modulation of the value of the first threshold; and
  a second validation circuit configured to validate the result of the comparison over a second duration of time.

17. The circuit according to claim 16, wherein the nominal voltage is a nominal battery voltage.

18. The circuit according to claim 16, wherein the supply voltage is a DC battery voltage.

19. The circuit according to claim 16, wherein the first validation circuit comprises a time delay circuit configured to determine whether a change in output of the first comparator circuit lasts for longer than said first duration of time.

20. The circuit according to claim 16, wherein the second validation circuit comprises a low pass filter configured to filter said information representative of the supply voltage.

21. A circuit, comprising:
  a transistor switch coupled in series with a load between a first power rail and a second power rail, wherein the transistor switch is configured to control delivery of current to the load; and
  a switch protection circuit having an input coupled to the first power rail and configured to modulate a control signal applied to a control terminal of the transistor switch, wherein the switch protection circuit comprises:
- a detection circuit configured to detect an overload across the transistor switch with respect to a first threshold; and
- a threshold control circuit configured to adjust a value of the first threshold as a function of variations in a supply voltage between the first and second power rails, wherein the threshold control circuit is configured to compare information representative of the supply voltage to a second threshold and modify the value of the first threshold if the second threshold is exceeded for a period in excess of a reference period which is longer than a duration of a transient variation in the supply voltage from a nominal voltage.

22. The circuit of claim 21, wherein the supply voltage is provided by a battery.

23. The circuit of claim 22, wherein the battery is a component of an automobile.

24. The circuit of claim 21, wherein the detection circuit comprises a comparator circuit configured to compare information representative of a current flowing through the transistor switch to said first threshold.

25. The circuit of claim 21, wherein the threshold control circuit comprises a low pass filter circuit configured to filter said information representative of the supply voltage prior to comparison by said threshold control circuit.

26. The circuit of claim 21, wherein the threshold control circuit comprises a set-reset flip flop actuated in a set state in response to a first logic result of the comparison and actuated in a reset state in response to a delay of a second logic result of the comparison, wherein an output of the set-reset flip flop is configured to adjust the value of the first threshold.

* * * * *